United States Patent [19]
Ogihara

[11] Patent Number: 5,371,710
[45] Date of Patent: Dec. 6, 1994

[54] SEMICONDUCTOR MEMORY DEVICE HAVING TEST MODE

[75] Inventor: Masaki Ogihara, Yokoyama, Japan

[73] Assignee: Kabushiki Kaisha Toshiba, Kawasaki, Japan

[21] Appl. No.: 46,799

[22] Filed: Apr. 16, 1993

[30] Foreign Application Priority Data

Apr. 16, 1992 [JP] Japan .................................. 4-096339

[51] Int. Cl.⁵ .............................................. G11C 13/00
[52] U.S. Cl. ................................ 365/230.01; 365/201; 365/189.01
[58] Field of Search ............... 365/201, 189.01, 230.01

[56]         References Cited
        U.S. PATENT DOCUMENTS

| 4,651,304 | 3/1987  | Takata .            |
|-----------|---------|---------------------|
| 4,654,849 | 3/1987  | White, Jr. et al. . |
| 4,751,679 | 6/1988  | Dehganpour .        |
| 4,873,669 | 10/1989 | Furutani et al. .   |
| 4,969,124 | 11/1990 | Luich et al. .      |
| 4,999,813 | 3/1991  | Ohtsuka et al. .    |
| 5,157,629 | 10/1992 | Sato et al. .       |
| 5,233,610 | 8/1993  | Nakayama et al. ................ 365/201 |
| 5,287,312 | 2/1994  | Okamura et al. .    |

Primary Examiner—Terrell W. Fears
Attorney, Agent, or Firm—Banner, Birch, McKie & Beckett

[57] ABSTRACT

A memory cell array, which is one of a plurality of divisional memory cell arrays, is selected by an address signal. One of the word lines incorporated in the memory cell array is selected by a row decoder. An OR circuit is supplied with a control signal for setting a burn-in test mode, and with the address signal for selecting the memory cell array. In the burn-in test mode, since the level of the control signal becomes high, the output level of the OR circuit becomes high irrespective of the address signal. Thus, the overall memory cell arrays are simultaneously selected, and hence more word lines than those accessed in a normal operation mode are simultaneously accessed.

31 Claims, 5 Drawing Sheets

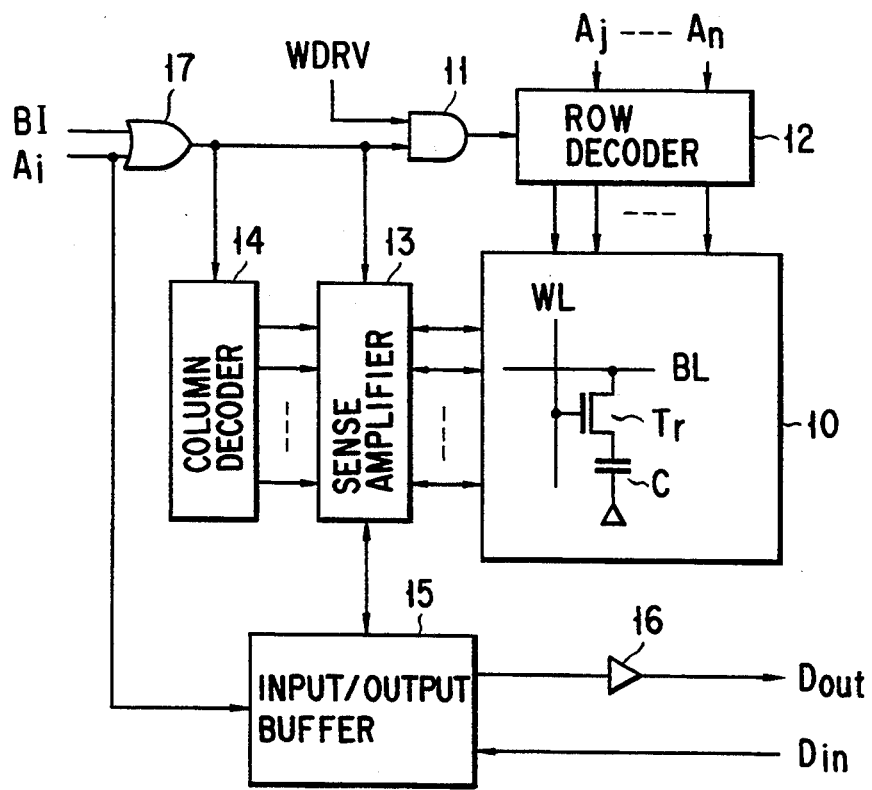
F I G. 1
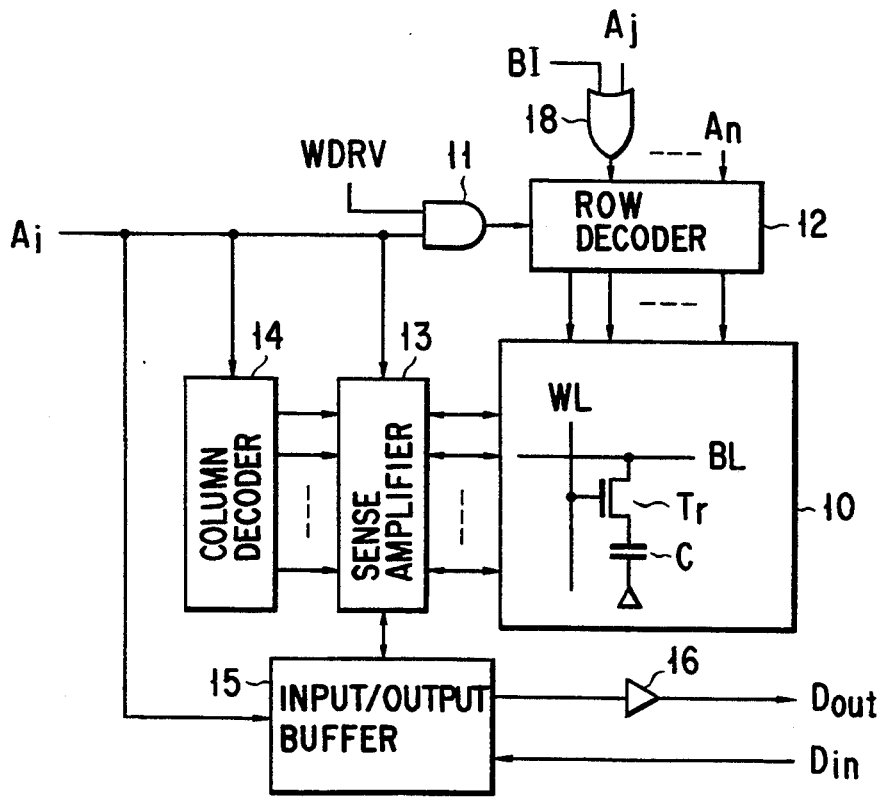
F I G. 2

SEMICONDUCTOR MEMORY DEVICE HAVING TEST MODE

BACKGROUND OF THE INVENTION

1. Field of the Invention

This invention relates to a burn-in test for a semiconductor memory device, and in particular, to a semiconductor memory device to be applied to defect screening of a transfer transistor constituting a memory cell.

2. Description of the Related Art

In a process of manufacturing semiconductor devices, in order to secure the reliability of them, screening is performed to detect and remove a device latently having a defect. Such screening chiefly employs "electric field acceleration" in which a voltage higher than in an usual case is applied, and "temperature acceleration" in which heat of a temperature higher than in an usual case is applied. Further, a burn-in test in which the electric field acceleration and temperature acceleration are carried out simultaneously is employed in many screening cases.

The burn-in test is effective to a device which may erroneously operate in an initial stage. When a semiconductor memory device is screened out by a burn-in test, many of the word lines of the device contained in a package are simultaneously accessed in the order of address at high temperature and voltage. In general, about 10000 memory cells are simultaneously tested at high temperature and voltage. Thus, the operation cycle of a burn-in test mode is extremely longer than the minimum operation cycle of the semiconductor memory device. Specifically, the minimum operation cycle of the memory device is about 150 nsec, while the operation cycle of the burn-in test mode is about 1.5 $\mu$sec.

In a semiconductor memory device, in particular in a DRAM, the overall memory cell array is divided into a plurality of memory cell arrays which operate individually, so as to reduce the charge/discharge amount of a maximum bit line. In this structure, only some of the memory cell arrays are operated in response to an address signal input from an external device.

Further, in the DRAM, the number of cycles during which its particular refresh operation is performed is set. Accordingly, the number of word lines to be able to be accessed in one cycle is necessarily determined by the refresh cycles. In the case of a 4M-bit DRAM, for example, the refresh cycle number is set to 1024/16 ms. If the number of word lines is 4096, it is necessary to select four word lines in each cycle irrespective of how the whole memory cell array is divided. Thus, the larger the number of divided memory cell arrays, the less the charge/discharge amount of each bit line.

FIG. 11 shows a semiconductor memory device. This memory device is divided into e.g. four memory cell arrays CA1–CA4, and only two of the memory cell arrays are operated when the device is turned on. Address signals Ai and /Ai (hereinafter "/" indicates an inverse signal) are used to select only two of the memory cell arrays. If the address signal Ai is of high level, left two memory cell arrays CA1 and CA2 are selected, while if it is of low level, right two memory cell arrays CA3 and CA4 are selected.

FIG. 12 shows in detail one of the memory cell arrays shown in FIG. 11. A memory cell array 10 has a plurality of transfer transistors Tr and capacitors C. The address signal Ai and a word-line driving voltage WDRV are supplied to an AND circuit 11. The output signal of the AND circuit 11 is supplied to a row decoder 12, which in turn controls the word line WL of the memory cell array 10. The address signal Ai is also supplied to a sense amplifier 13, a column decoder 14, and an inputs/output buffer 15. The amplifier 13 is connected to the decoder 14 and buffer 15. Thus, the address signal Ai selects word lines at the time of refresh operation or other operations, restores cell data, reads data from a bit line corresponding to a column address signal, and controls to write data into a bit line. It is possible to commonly use the column decoder 14 for the overall memory cell arrays or some of them. In this case, it is not necessary to control the decoder 14 by the address signal Ai.

FIG. 13 shows the conventional word-line booster circuit. This booster circuit controls one of the word lines included in the memory cell arrays selected by the address signal Ai. In FIG. 13, an element corresponding to that shown in FIG. 12 is denoted by a corresponding reference numeral. Address signals An and /An are supplied to the input terminal of an OR circuit OR. The output terminal of the OR circuit is connected to an end of a boosting capacitor C1, which outputs the word-line driving voltage WDRV from the other end thereof. The driving voltage WDRV is supplied to an end of the current path of the transistor constituting the AND circuit 11.

In the above structure, the row decoder 12 supplied with each of the address signals Ai–An selects a corresponding word line. It is necessary in the DRAM to increase the potential of the word line to a value higher than $V_{CC}+V_{TH}$ ($V_{TH}$ is the threshold voltage of the memory cell transistor; $V_{CC}$ is a power source potential) so as to resupply the power source potential $V_{CC}$ to each memory cell. To this end, after detecting that the address to be input to the row decoder 12 is determined, the potential of a corresponding word line is increased to a predetermined value by the boosting capacitor C1. The capacity of the capacitor C1 is calculated on the basis of the capacities of word lines selected during operation of the device, and a predetermined potential to which the word lines should be increased.

As is aforementioned, screening of a semiconductor memory device by a burn-in test is performed by successively accessing word lines in the order of address. In the burn-in test mode, however, successive accessing of word lines is disadvantageous in that the transfer transistor of a memory cell connected to each word line is supplied with a voltage stress at very lower frequency than a transistor in the peripheral circuit.

Specifically, in the case of 4M-bit DRAM, the number of the overall word lines is 4096, and the number of word lines selected in one cycle is only four. Accordingly, the transfer transistors of the overall memory cells are completely examined in 1024 cycles, which means that the transfer transistor of each memory cell receives a voltage stress for only 1/1024 of a time period for which each transistor in the peripheral circuit receives the voltage stress. This is undesirable in light of the aim of screening to detect and remove a defective device.

Further, in recent DRAMs, the capacitor electrode of each memory cell is generally supplied with a half $V_{CC}/2$ of the power source voltage. Thus, a relatively low electric field is applied thereto, and therefore no reliability problems associated with a thin capacitor insulting film will occur. On the other hand, about 3/2 of the power source voltage $V_{CC}$ is applied to the gate of a transistor. In this case, even though a relatively high electric field is applied, a reliability problem may exist if the gate oxide film of the transistor is thick. Therefore, it is necessary to screen a transistor by applying a high voltage (such as the transfer transistor of a memory cell). However, in the case of the transfer transistor, screening is performed once in 1024 cycles as described above, which means that sufficient screening cannot be carried out.

In addition, if the degree of integration of a DRAM is, for example, quadrupled, the refresh cycle is doubled. That is, the higher the degree of integration, the longer the burn-in test. In summary, the conventional device is disadvantageous in that a voltage stress is applied to the transfer transistor of each memory cell only at low frequency.

SUMMARY OF THE INVENTION

It is the object of the invention to provide a semiconductor memory device capable of increasing the stress acceleration coefficient of the transfer transistor of each memory cell, and increasing the frequency at which a voltage stress is applied to the transfer transistor.

To attain the above object, the semiconductor memory device of the invention comprises:
- a memory cell array having a plurality of word lines, bit lines, and memory cells, each of the memory cells is connected to a corresponding one of the word lines and a corresponding one of the bit lines;
- selection means for selecting the word lines of the memory cell array in accordance with an address signal; and
- control means for controlling the selection means in accordance with a control signal indicating a test mode, the control means causing the selection means to select more word lines than those selected in a normal operation mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram, showing a first embodiment of the invention;

FIG. 2 is a circuit diagram, showing a second embodiment of the invention;

DETAILED DESCRIPTION OF THE PREFERRED EMBODIMENTS

Embodiments of the invention will be explained with reference to the accompanying drawings.

FIG. 1 shows a first embodiment of the invention, in which more memory cell arrays than those operated in a normal operation mode are operated in a burn-in test mode.

Figure 11:
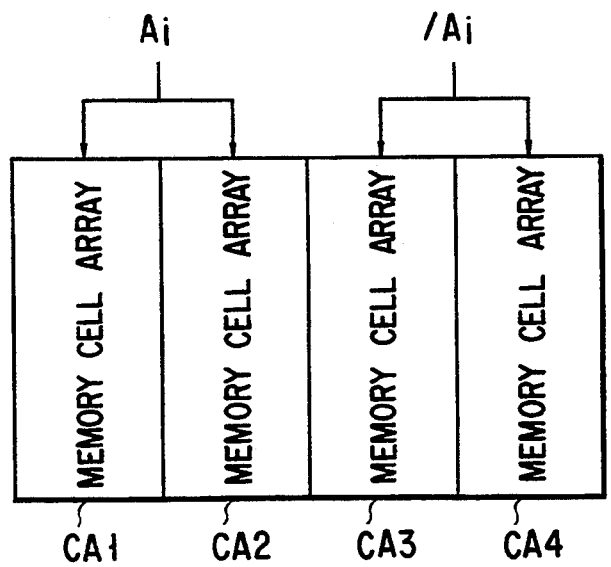
FIG. 11 shows a conventional semiconductor memory device.

Like FIG. 11, FIG. 1 shows one (=a memory cell array 10) of, for example, four divisional memory cell arrays employed in the memory device. In the memory cell array 10, a transfer transistor Tr and a capacitor C are provided at the intersection of a word line WL and a bit line BL.

A control signal BI for setting the burn-in test mode and an address signal Ai are supplied to an OR circuit 17. The output signal of the OR circuit 17 is supplied to an AND circuit 11, together with a driving voltage WDRV for driving the word lines. The output signal of the AND circuit 11 is supplied to a row decoder 12 connected to the memory cell array 10, together with address signals Aj–An. The decoder 12 decodes the address signals Aj–An, to thereby select one of the word lines WL. The output signal of the OR circuit 17 is supplied to a sense amplifier 13 and a column decoder 14. The column decoder 14 is connected to the sense amplifier 13, which is connected to the memory cell array 10. The column decoder 14 selects one of the bit lines BL in accordance with the output signal of the OR circuit 17. The sense amplifier 13 amplifies a signal read out of the bit line BL. An input/output buffer 15 is controlled by the address signal Ai. The buffer 15 supplies a write data Din to the sense amplifier 13 at the time of writing data, and outputs data supplied from the sense amplifier 13 at the time of reading data. This data is output as output data Dout via a buffer circuit 16. Generation of the control signal BI will be explained later.

Figure 12:
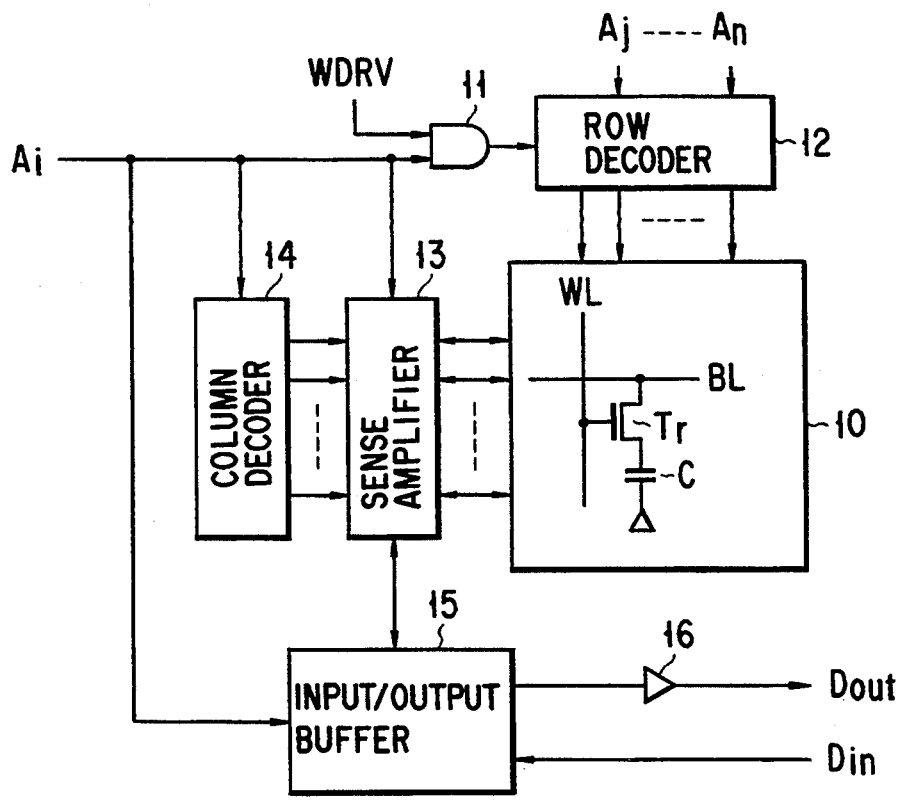
FIG. 12 shows one of the memory cell arrays shown in FIG. 11.
Figure 13:
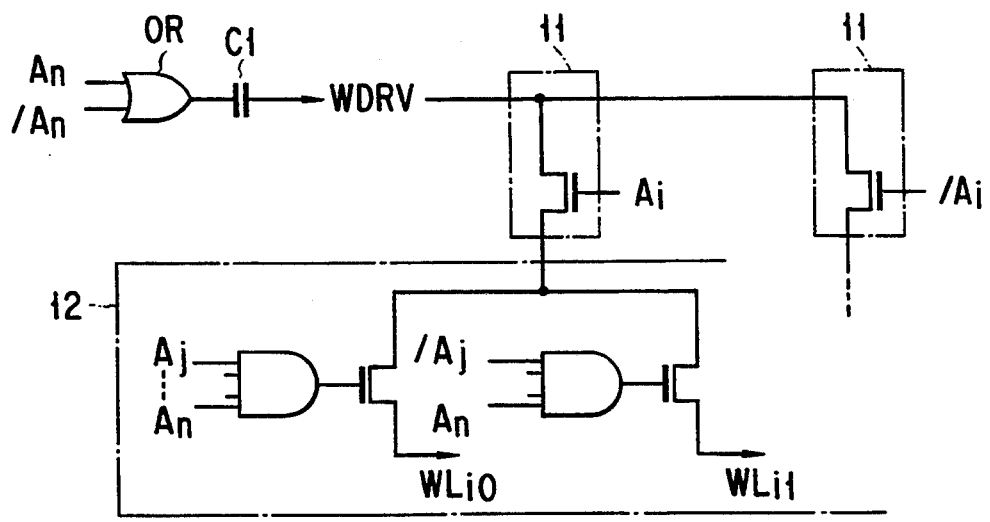
FIG. 13 shows a conventional word-line booster circuit.

In the above structure, the row decoder 12, sense amplifier 13, and column decoder 14 are controlled by the control signal BI. In the normal operation mode, the level of the control signal BI is kept low. In this case, the circuit of FIG. 1 is equivalent to that of FIG. 12, and the same operation as in FIG. 12 can be performed.

On the other hand, at the time of performing a burn-in test, the level of the control signal BI is high, which prevents the row decoder 12, sense amplifier 13, and column decoder 14 from being controlled by the address signal Ai. Though in the normal operation mode, only two of the four memory cell arrays are operated, all of the memory cell arrays are operated when the control signal BI is at high level. In other words, at the time of the burn-in test, an operation equivalent to that performed when the refresh cycle of the memory cell array becomes ½ is performed. However, since the input/output buffer 15 is controlled by the address signal Ai, read/write of data is performed in the same manner as in the normal operation.

Suppose that the memory cell array is divided into eight arrays, and only one memory cell array is operated in the normal operation. In this case, a circuit structure in which two or four of the eight memory cell arrays are operated in the burn-in test mode can be realized.

FIG. 2 shows a second embodiment of the invention, in which elements similar to those of FIG. 1 are denoted by corresponding reference numeral, and explanation will be given of only different elements in FIG. 2. In this embodiment, the row decoder 12, sense amplifier 13, column decoder 14, and input/output buffer 15 are controlled by the address signal Ai. The address signal Aj, for example, among the address signals Aj-An and the control signal BI are supplied to the row decoder 12 via an OR circuit 18. The address signal controlled by the control signal BI is not limited to the address signal Aj, but may be any one of the address signals Aj-An.

In the adore structure, the number of the memory cell arrays to be operated in the burn-in test mode is the same as that of the arrays operated in the normal operation mode. However, a plurality of word lines can be simultaneously selected in one memory cell array. Specifically, this can be done by selecting a plurality of row decoders by the control signal BI, irrespective of whether the address signal Aj is at high or low level. In this case, the overall word lines can be operated by controlling all the address signals Aj-An, but it is preferable to operate particular word lines.

In general, data stored in a memory cell selected by a word line is amplified by the sense amplifier to have a level of $V_{CC}$ or $V_{SS}$, and again written into the same cell. when the level of the bit line is amplified to $V_{SS}$, an electric field between the gate (word line) and drain (bit line) of the transfer transistor becomes maximum. It is the largest object of the burn-in test to detect whether or not the gate oxide film is broken by the electric field.

Figure 3:
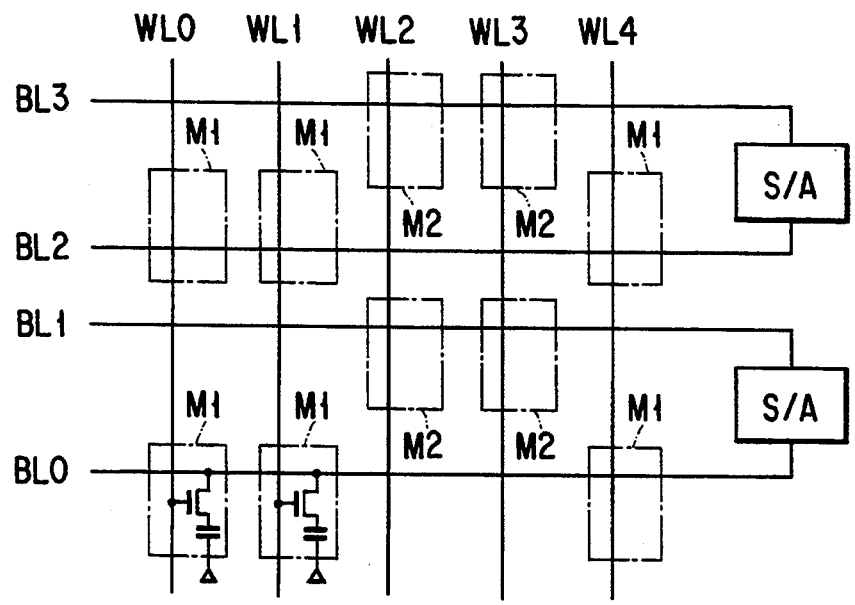
FIG. 3 is a view, useful in explaining an example of a word-line selecting method.

However, in the case of operating the overall word lines WL0–WL4 as shown in FIG. 3, memory cells M1 and M2 are simultaneously selected, which are respectively connected to a bit line pair BL0 and BL1 and a bit line pair BL2 and BL3 commonly connected to a single sense amplifier (S/A). Thus, when the sense amplifier is operated, which one of the bit line pairs has the level $V_{SS}$ does not depend upon the data stored in the memory cell, which means that sufficient screening can not necessarily be done. To avoid this, it is preferable to control the address signals Aj-An so that only the word lines serving as the gates of memory cell transistors connected to one of the bit line pairs could be selected. In other words, it is desirable to control so as not to simultaneously select the word line group WL0, WL1, WL4 and the word line group WL2, WL3.

In the above-described first and second embodiments, the number of word lines selected in the burn-in test mode is larger than that of word lines selected in the normal operation mode. The conventional word-line booster circuit employs boosting capacitors having a capacitor calculated on the basis of the number of word lines selected in the normal operation mode. Thus, when more word lines than those used in the normal operation mode are selected, the word lines are not increased to a predetermined potential. It is necessary to employ the word line booster circuit as shown in FIGS. 4 or 5.

Figure 4:
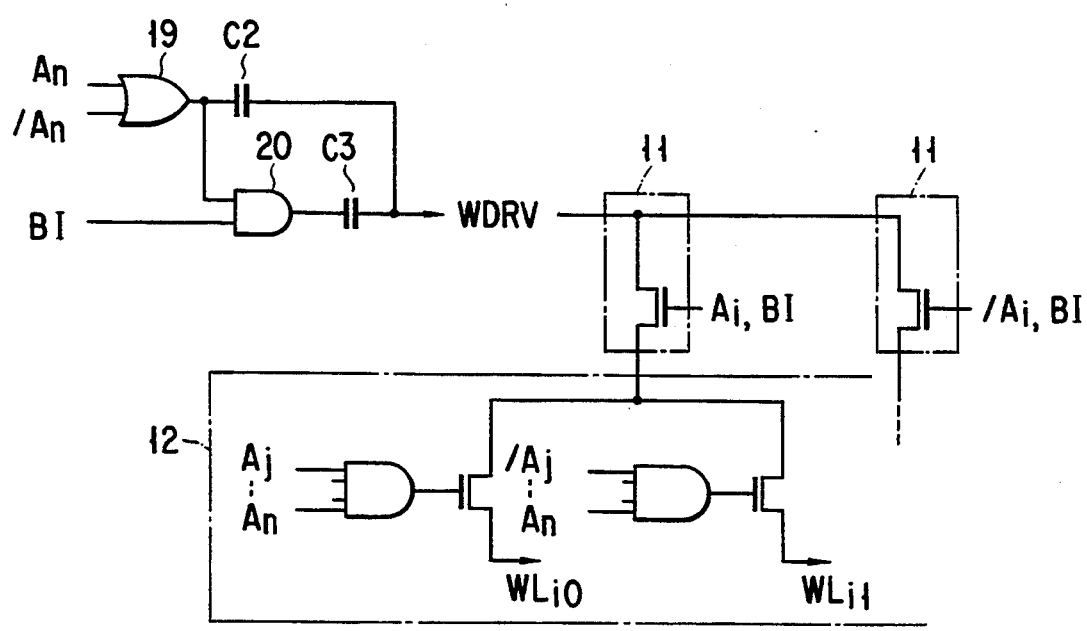
FIG. 4 is a circuit diagram, showing a word-line booster circuit employed in the first embodiment of FIG. 1.
Figure 5:
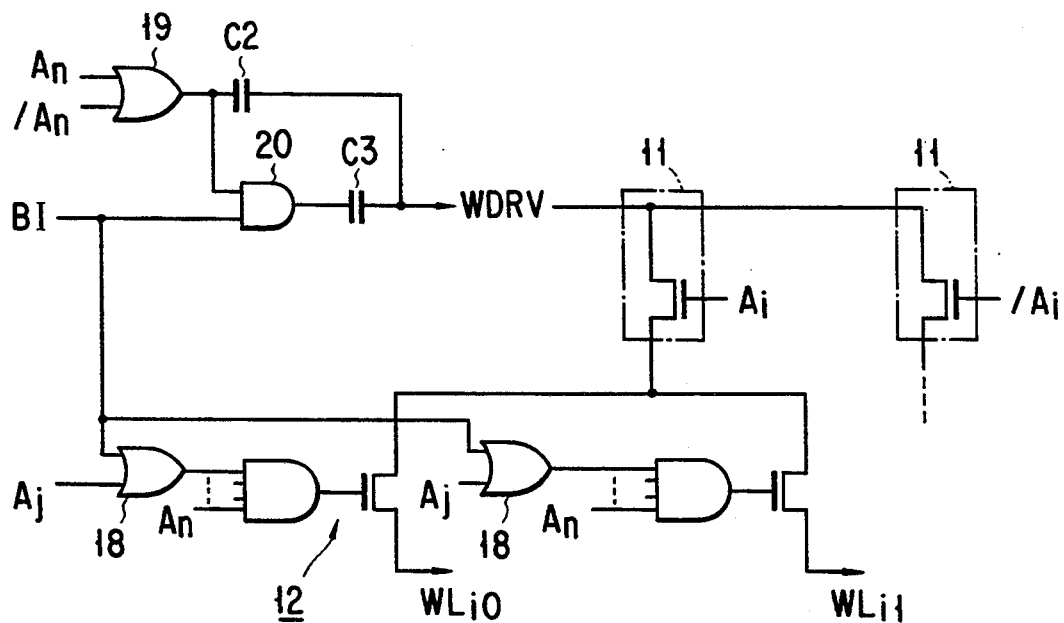
FIG. 5 is a circuit diagram, showing a word-line booster circuit employed in the second embodiment of FIG. 2.

FIGS. 4 and 5 show word-line booster circuits to be applied to the first and second embodiments of FIGS. 1 and 2, respectively. In FIGS. 4 and 5, elements similar to those in FIGS. 1 and 2 are denoted by corresponding reference numerals or signs.

As is shown in FIGS. 4 and 5, the address signals An and /An are supplied to the input terminals of an OR circuit 19, which in turn supplies its output signal to a terminal of a boosting capacitor C2 and also to an input terminal of an AND circuit 20. The control signal BI is supplied to the other input terminal of the AND circuit 20. The output signal of the circuit 20 is supplied to a terminal of a boosting capacitor C3. The other terminals of the boosting capacitors C2 and C3 are connected to an input terminal of the AND circuit 11.

In the above structure, there are provided the boosting capacitors C2 and C3, and the control signal BI is applied to the capacitor C3. In the normal operation mode, since the control signal BI is at low level, the output terminal of the AND circuit 20 is at low level, and hence the boosting capacitor C3 is not charged. Accordingly, the word-line driving voltage WDRV is generated only by the boosting capacitor C2. In the burn-in test mode, the control signal BI is at high level, the driving voltage WDRV of a level higher than in the normal operation mode is generated by both the boosting capacitors C2 and C3. Thus, the potential of the word lines is increased to a predetermined level both in the normal operation mode and in the burn-in test mode.

Then, methods for generating the control signal BI will be explained.

Figure 6:
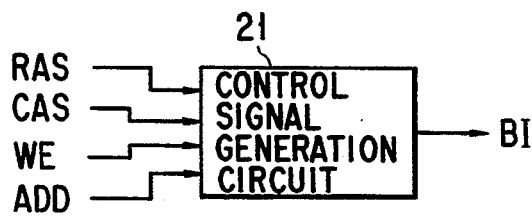
FIG. 6 is a circuit diagram, showing an example of a circuit for generating a control signal BI.

FIG. 6 shows a circuit for generating the control signal BI in a case where a sequence of input signals, which is not employed in the normal operation mode, is supplied from the external of a chip. Specifically, a control signal generation circuit 21 receives a RAS (Row Address Strobe) signal, a CAS (Column Address Strobe) signal, a WE (Write Enable) signal, and an address signal ADD. As regards the RAS, CAS, WE, and ADD signals, a sequence of them is determined for writing and reading data in the normal operation mode.

Figure 7:
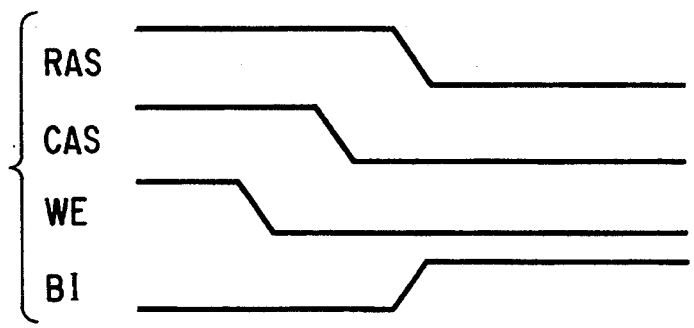
FIG. 7 is a timing chart, useful in explaining sequence of input signals in a burn-in test mode.

FIG. 7 shows an example of a sequence of the RAS, CAS, and WE signals obtained when the control signal BI is generated. This sequence is not employed in the normal operation mode, but in the burn-in test mode. The control signal generation circuit 21 determines whether or not the sequence of the RAS, CAS, and WE signals is a normal sequence, and generates the control signal BI when the sequence differs from a normal one. Further, it can be modified such that the circuit 21 generates the control signal BI by judging the sequence of the RAS, CAS, and WE signals, and at the same time determining whether or not the address signal ADD is input.

Figure 8:
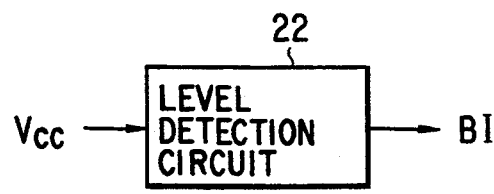
FIG. 8 is a circuit diagram, showing another example of e circuit for generating the control signal BI.

FIG. 8 shows a circuit for generating the control signal BI after detecting a power source voltage. The burn-in test can be performed also by varying the power source voltage which is normally constant. In this case, a level detection circuit 22 detects the level of the power source voltage $V_{CC}$, and generates the control signal BI when the detected level is not a level which is not used in the normal operation mode.

Figure 9:
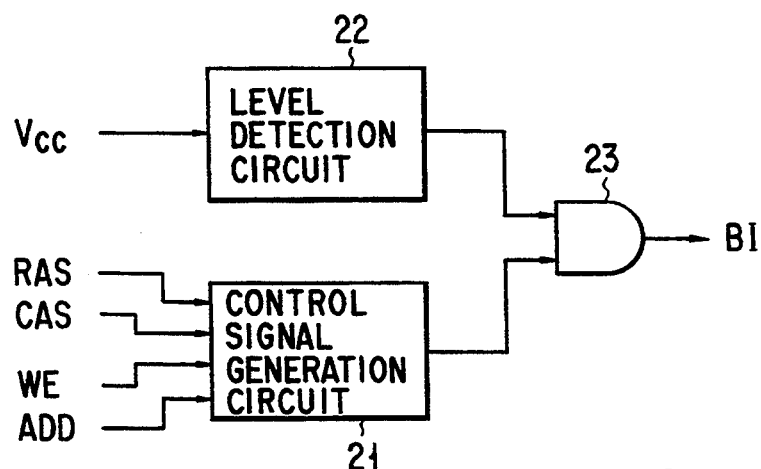
FIG. 9 is a circuit diagram, showing a further example of a circuit for generating the control signal BI.

FIG. 9 shows a combination of FIGS. 7 and 8. The output terminals of the control signal generation circuit 21 and level detection circuit 22 are connected to an AND circuit 23. The AND circuit 23 generates the control signal BI when the control signal generation circuit 21 determines that the sequence of the RAS, CAS, and WE signals differs from a normal one, and at the same time when the level detection circuit 22 detects a power source voltage which is not used in the normal operation mode.

Figure 10:
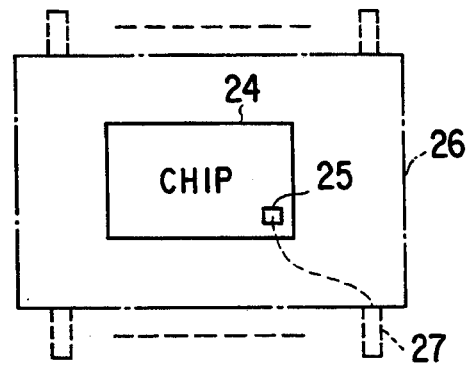
FIG. 10 is a circuit diagram, showing another example of a circuit for generating the control signal BI.

FIG. 10 shows a structure in which the control signal BI is supplied from the outside of a chip 24 through a pad 25 dedicated to the chip, instead of generating the signal BI in the chip. In a package 26, there are provided a pin 27 connected to the pad 25 and dedicated to the control signal BI, in addition to usual pins dedicated to input/output signals. The normal operation mode is shifted to the burn-in test mode by applying a predetermined voltage to the pin 27.

Moreover, it is possible to mount the pad 25 on a chip in a wafer stage and apply a predetermined voltage thereto, so as to examine the chip in the wafer stage by a test similar to the burn-in test.

In the first and second embodiments, in the burn-in test mode, word lines, memory cell arrays, or word lines in each memory cell array, more than those used in the normal operation mode, are selected. Thus, the frequency at which a voltage stress is applied to the transfer transistor of each memory cell can be increased, thereby enhancing the reliability of the burn-in test, and considerably shortening the time required to perform the test.

Moreover, the control signal instructing the burn-in test can be easily generated when the sequence of input signals for controlling the memory cell array differs from that assumed in the normal operation mode, or when the power source voltage differs form that assumed in the normal operation mode, or when these conditions are not satisfied. Further, the control signal can be taken directly from the outside of a chip.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
a memory cell array having a plurality of word lines, bit lines, and memory cells, each of the memory cells connected to a corresponding one of the word lines and a corresponding one of the bit lines;
word line selection means for selecting the word lines of the memory cell array in accordance with an address signal;
word line driving means for driving word lines selected by said word line selection means; and
control means, responsive to a test mode signal indicating whether the device is to operate in one of a normal operation mode and a test mode, for controlling the word line selection means to select a first number of word lines in said normal operation mode, and for controlling the word line selection means to select a second number of word lines in said test mode, said second number being greater than said first number.

2. The device according to claim 1, further comprising a sense amplifier connected to a corresponding pair of bit lines, word line the selection means selecting word lines so as to select those of the memory cells which are connected to one of the pair of bit lines.

3. The device according to claim 1, further comprising generation means, supplied with a plurality of input signals, for generating the test mode signal when a particular sequence of the input signals is detected.

4. The device according to claim 1, further comprising generation means, supplied with a power source voltage, for generating the test mode signal when a particular power source voltage is detected.

5. The device according to claim 1, further comprising:
first generation means, supplied with a power source voltage, for generating a first control signal when a particular power source voltage is detected;
second generation means, supplied with a plurality of input signals, for generating a second control signal when a particular sequence of the input signals is detected; and
third generation means for generating the test mode signal when the first and second generation means generate the first and second control signals.

6. The device according to claim 1, wherein the control means has a terminal for receiving the test mode signal from outside the device.

7. The device according to claim 1, wherein said word line driving means comprises word line boosting means for increasing the potential of the word lines selected by said word line selection means to a first predetermined voltage in said normal operation mode, and for increasing the potential of the word lines selected by said word line selection means to a second predetermined voltage in said test mode, said second predetermined voltage being higher than said first predetermined voltage.

8. A semiconductor memory device comprising:
a plurality of memory cell arrays, each of which includes a plurality of memory cells;
array selection means for selecting the memory cell arrays in accordance with a first address signal; and
control means, responsive to a test mode signal indicating whether the device is to operate in one of a normal operation mode and a test mode, for controlling the array selection means to select a first number of memory cell arrays in said normal operation mode, and for controlling the array selection means to select a second number of memory cell arrays in said test mode, said second number being greater than said first number.

9. The device according to claim 8, further comprising generation means, supplied with a plurality of input signals, for generating the test mode signal when a particular Sequence of the input signals is detected.

10. The device according to claim 8, further comprising generation means, supplied with a power source voltage, for generating the test mode signal when a particular power source voltage is detected.

11. The device according to claim 8, further comprising:
first generation means, supplied with a power source voltage, for generating a first control signal when a particular power source voltage is detected;
second generation means, supplied with a plurality of input signals, for generating a second control signal when a particular sequence of the input signals is detected; and third generation means for generating the test mode signal when the first and second generation means generate the first and second control signals.

12. The device according to claim 8, wherein the control means has a terminal for receiving the test mode signal from outside the device.

13. The device according to claim 8, further comprising:
   word line selection means for selecting word lines of each of the memory cell arrays in accordance with a second address signal;
   word line driving means for driving word lines selected by said word line selection means, said word line driving means comprising word line boosting means for increasing the potential of the word lines selected by said word line selection means to a first predetermined voltage in said normal operation mode, and for increasing the potential of the word lines selected by said word line selection means to a second predetermined voltage in said test mode, said second predetermined voltage being higher than said first predetermined voltage.

14. A semiconductor memory device comprising:
   a plurality of memory cell arrays each having a plurality of word lines, bit lines, and memory cells, each of the memory cells connected to a corresponding one of the word lines and a corresponding one of the bit lines;
   word line selection means for selecting the word lines of each of the memory cell arrays in accordance with an address signal;
   word line driving means for driving word lines selected by said word line selection means;
   generation means for generating a test mode signal indicating whether the device is to operate in one of a normal operation mode and a test mode;
   control means, responsive to said test mode signal, for controlling the word line selection means to select a first number of word lines in said normal operation mode, and for controlling the word line selection means to select a second number of word lines in said test mode, said second number being greater than said first number; and
   said word line driving means comprising word line boosting means for increasing the potential of the word lines selected by said word line selection means to a first predetermined voltage in said normal operation mode, and for increasing the potential of the word lines selected by said word line selection means to a second predetermined voltage in said test mode, said second predetermined voltage being higher than said first predetermined voltage.

15. A semiconductor memory device comprising:
   a plurality of memory cell arrays, each of which includes a plurality of memory cells;
   word line selection means for selecting word lines of each of the memory cell arrays in accordance with a first address signal;
   word line driving means for driving word lines selected by said word line selection means;
   array selection means for selecting the memory cell arrays in accordance with a second address signal;
   generation means for generating a test mode signal indicating whether the device is to operate in one of a normal operation mode and a test mode;
   control means, responsive to said test mode signal, for controlling the array selection means to select a first number of memory cell arrays in said normal operation mode, and for controlling the array selection means to select a second number of memory cell arrays in said test mode, said second number being greater than said first number; and
   said word line driving means comprising word line boosting means for increasing the potential of the word lines selected by said word line selection means to a first predetermined voltage in said normal operation mode, and for increasing the potential of the word lines selected by said word line selection means to a second predetermined voltage in said test mode, said second predetermined voltage being higher than said first predetermined voltage.

16. The device according to claim 3, wherein said input signals are control signals supplied to said device for controlling operation of the device, and said particular sequence of input signals differs from a sequence of the control signals supplied to the device during the normal operation mode.

17. The device according to claim 4, wherein the particular power source voltage differs from a power source voltage of the normal operation mode.

18. The device according to claim 5, wherein the particular power source voltage differs from a power source voltage of the normal operation mode.

19. The device according to claim 5, wherein said input signals are control signals supplied to said device for controlling operation of the device, and said particular sequence of input signals differs from a sequence of the control signals supplied to the device during the normal operation mode.

20. The device according to claim 9, wherein said input signals are control signals supplied to said device for controlling operation of the device, and said particular sequence of input signals differs from a sequence of the control signals supplied to the device during the normal operation mode.

21. The device according to claim 10, wherein the particular power source voltage differs from a power source voltage of the normal operation mode.

22. The device according to claim 11, wherein the particular power source voltage differs from a power source voltage of the normal operation mode.

23. The device according to claim 11, wherein said input signals are control signals supplied to said device for controlling operation of the device, and said particular sequence of input signals differs from a sequence of the control signals supplied to the device during the normal operation mode.

24. The device according to claim 1, wherein said control means comprises an OR circuit having a first input supplied with said test mode signal, a second input supplied with said address signal, and an output for controlling said word line selection means.

25. The device according to claim 8, wherein said control means comprises an OR circuit having a first input supplied with said test mode signal, a second input supplied with said first address signal, and an output for controlling said array selection means.

26. The device according to claim 14, wherein said control means comprises an OR circuit having a first input supplied with said test mode signal, a second input supplied with said address signal, and an output for controlling said word line selection means.

27. The device according to claim 15, wherein said control means comprises an OR circuit having a first input supplied with said test mode signal, a second input supplied with said first address signal, and an output for controlling said array selection means.

28. The device according to claim 7, wherein said word line boosting means comprises:
   a first boosting capacitor having a first electrode connected to a word boosting line;
   a second boosting capacitor having a first electrode connected to said word boosting line; and
   an AND gate, having an input supplied with said test mode signal and an output connected to a second electrode of said second boosting capacitor, for activating said second boosting capacitor when said test mode signal has a first binary logic level indicating said test mode.

29. The device according to claim 13, wherein said word line boosting means comprises:
   a first boosting capacitor having a first electrode connected to a word boosting line;
   a second boosting capacitor having a first electrode connected to said word boosting line; and
   an AND gate, having an input supplied with said test mode signal and an output connected to a second electrode of said second boosting capacitor, for activating said second boosting capacitor in response to said test mode signal having a first binary logic level indicating said test mode.

30. The device according to claim 14, wherein said word line boosting means comprises:
   a first boosting capacitor having a first electrode connected to a word boosting line;
   a second boosting capacitor having a first electrode connected to said word boosting line; and
   an AND gate, having an input supplied with said test mode signal and an output connected to a second electrode of said second boosting capacitor, for activating said second boosting capacitor in response to said test mode signal having a first binary logic level indicating said test mode.

31. The device according to claim 15, wherein said word line boosting means comprises:
   a first boosting capacitor having a first electrode connected to a word boosting line;
   a second boosting capacitor having a first electrode connected to said word boosting line; and
   an AND gate, having an input supplied with said test mode signal and an output connected to a second electrode of said second boosting capacitor, for activating said second boosting capacitor in response to said test mode signal having a first binary logic level indicating said test mode.

* * * * *